(12) United States Patent
Im et al.

(10) Patent No.: US 7,838,438 B2
(45) Date of Patent: Nov. 23, 2010

(54) DIELECTRIC LAYER, METHOD OF MANUFACTURING THE DIELECTRIC LAYER AND METHOD OF MANUFACTURING CAPACITOR USING THE SAME

(75) Inventors: Ki Vin Im, Seoul (KR); Jae Hyun Yeo, Bucheon-si (KR); Kyoung Ryul Yoon, Koyang (KR); Jong Cheol Lee, Seoul (KR); Eun Ae Chung, Suwon (KR); Young Sun Kim, Suwon (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 586 days.

(21) Appl. No.: 11/363,186

(22) Filed: Feb. 28, 2006

(65) Prior Publication Data

US 2007/0059895 A1    Mar. 15, 2007

(30) Foreign Application Priority Data

Sep. 13, 2005    (KR) ...................... 10-2005-0085209

(51) Int. Cl.
*H01L 21/31*    (2006.01)
(52) U.S. Cl. ................ 438/778; 438/785; 257/E21.282
(58) Field of Classification Search ................ 438/785, 438/778; 257/E21.282
See application file for complete search history.

(56) References Cited

U.S. PATENT DOCUMENTS

| | | | | |
|---|---|---|---|---|
| 6,884,719 | B2* | 4/2005 | Chang et al. ................. | 438/785 |
| 7,034,369 | B2* | 4/2006 | Arikado et al. .............. | 257/411 |
| 7,094,712 | B2* | 8/2006 | Im et al. ...................... | 438/785 |
| 7,312,494 | B2* | 12/2007 | Ahn et al. .................... | 257/310 |
| 7,425,761 | B2* | 9/2008 | Choi et al. ................... | 257/701 |
| 2004/0033661 | A1* | 2/2004 | Yeo et al. ..................... | 438/253 |
| 2005/0239297 | A1* | 10/2005 | Senzaki et al. .............. | 438/785 |

FOREIGN PATENT DOCUMENTS

KR    2004-93255    11/2004

OTHER PUBLICATIONS

Korean Office Action dated May 3, 2007 issued in KR 2005-85209.

* cited by examiner

*Primary Examiner*—W. David Coleman
*Assistant Examiner*—Sun M Kim
(74) *Attorney, Agent, or Firm*—Stanzione & Kim LLP

(57) ABSTRACT

A dielectric layer, an MIM capacitor, a method of manufacturing the dielectric layer and a method of manufacturing the MIM capacitor. The method of manufacturing the dielectric layer includes chemically reacting a metal source with different amounts of an oxidizing agent based on the cycle of the chemical reactions in order to control leakage characteristics of the dielectric layer, the electrical characteristics of the dielectric layer, and the dielectric characteristics of the dielectric layer.

16 Claims, 7 Drawing Sheets

US 7,838,438 B2

DIELECTRIC LAYER, METHOD OF MANUFACTURING THE DIELECTRIC LAYER AND METHOD OF MANUFACTURING CAPACITOR USING THE SAME

REFERENCE TO RELATED APPLICATIONS

This application claims the priority of Korean Patent Application Nos. 2005-85209, filed on Sep. 13, 2005, in the Korean Intellectual Property Office, the disclosures of which are incorporated herein in its entirety by reference.

BACKGROUND OF THE INVENTION

1. Field of the Invention

The present general inventive concept relates to a dielectric layer, an MIM (Metal-Insulator-Metal) capacitor using the dielectric layer, and a method of forming the dielectric layer and capacitor using the dielectric layer.

2. Description of the Related Art

MIM (Metal-Insulator-Metal) capacitors are currently used in semiconductor technology as storage devices to store data due in part to their electrical characteristics. The electrical characteristics of MIM (Metal-Insulator-Metal) capacitors depend on the electrical characteristics of dielectric layer(s) formed therein as part of the capacitor device. Moreover, the electrical characteristics of the dielectric layer are largely divided into the leakage current characteristics and the dielectric characteristics. Experimentally, the leakage current characteristics of the dielectric layer closely depend on the impurities content, the composition ratio and the interface characteristics of the dielectric layer. The dielectric characteristics of the dielectric layer depend on the equivalent thickness of oxide within the dielectric layer.

More specifically, the dielectric layer of an MIM capacitor is deposited by supplying both a metal source material and an oxidation agent in order to form a dielectric layer having a high dielectric constant and excellent leakage current characteristics, through either an Atomic Layer Deposition (ALD) process or a Chemical Vapor Deposition (CVD) process. Further, an oxidizing agent plays very important role to remove residual un-reacted by product such as hydrogen carbon bonding. The residual hydrogen carbon bonding in formed oxide layer is then effectively removed through a chemical reaction with sufficient oxidizing agent. Further, amount of the residual hydrogen carbon impurities are as function of the concentration and supplying amount of the oxidizing agent.

FIG. 1 is a chart illustrating leakage currents of an MIM capacitor based on a supplying time of an oxidizing agent when forming a dielectric layer of the MIM capacitor. In FIG. 1, the MIM capacitor represented in the illustrated chart includes a $ZrO_2$ layer formed by an ALD process. More specifically, the solid line (a) represents leakage current of the MIM capacitor when an oxidizing agent is supplied for a time of about 10 seconds; the dotted line (b) represents leakage current of the MIM capacitor when an oxidizing agent is supplied for a time of about 5 seconds; and the solid line (c) represents leakage current of the MIM capacitor when an oxidizing agent is supplied for a time of about 3 seconds. It is evident by the results illustrated in FIG. 1 that leakage current characteristics are improved proportionally with an increase in the supplying time of the oxidizing agent.

FIG. 2 is a chart illustrating breakdown voltages vs. the effective equivalent oxide thickness [EOT] of an MIM capacitor in accordance with a supplying time of an oxidizing agent. As can be seen from the chart of FIG. 2, as the supplying time of an oxidizing agent is increased, the breakdown voltage increases while the EOT also increases. More specifically, as can be seen by the line (a) represented by squares, when the oxidizing agent supplying time is approximately 10 seconds, a high breakdown voltage of an MIM capacitor results while the leakage current characteristics thereof is low. As the supplying time of the oxidizing agent is decreased to approximately 5 seconds, as illustrated in line (b), the breakdown voltage of an MIM capacitor is lowered while the leakage current characteristics thereof increases, resulting in less desirable properties of the MIM capacitor. Finally, line (c) illustrates where the supplying time of the oxidizing agent in decreased further to approximately 3 seconds, resulting in a further decrease in the breakdown voltage of an MIM capacitor and even higher leakage current characteristics. Therefore, as the supplying time of the oxidizing agent is increased, the leakage current characteristics of the capacitor are most desirable.

FIG. 3 illustrates a graph of the intensity of carbon contents (cnts/s) vs. time (sec) in a dielectric layer as different amounts of oxidizing agent are supplied during formation of the dielectric layer. As illustrated in FIG. 3, as the supplying time of the oxidizing agent is increased, the intensity of the carbon content in the dielectric layer decreases and the amount of dielectric components increases. Thus, it has been determined that the concentration and supplying amount of the oxidizing agent (or oxidation source) have to be increased in order to improve the leakage current characteristics of the dielectric layer.

However, when the supplying time of the oxidizing agent is increased in cycles, problems exist.

Above all, an increase in the supplying time of the oxidizing agent results in a serious increase in the time required in manufacturing the capacitor results. Furthermore, growing of interfacial layer between dielectric layer and bottom electrode increases the effective equivalent oxide thickness (EOT) when the supplying time of the oxidizing agent is increased. FIG. 4 illustrates how the concentration of interfacial oxide such as $TiO_2$ (in special case as TiN electrode) increases with time as the amount of oxidizing agent increases.

SUMMARY OF THE INVENTION

The present general inventive concept provides a method of fabricating a dielectric layer having improved electrical characteristics, leakage current characteristics and dielectric characteristics thereof while decreasing the time required for fabricating the dielectric layer.

The present general inventive concept also provides a method of manufacturing a capacitor using a dielectric layer with improved electrical characteristics while decreasing the time required for manufacturing the capacitor.

Additional aspects and advantages of the present general inventive concept will be set forth in part in the description which follows and, in part, will be obvious from the description, or may be learned by practice thereof.

The foregoing and/or other utilities of the present general inventive concept are achieved by providing a method of forming a dielectric layer by a deposition process, including feeding a metal source on a surface of a semiconductor substrate such that a first portion of the metal source is chemisorbed on the substrate and a second portion of the metal source is physisorbed on the substrate; removing the second portion of the metal source by a purge process; supplying a first predetermined amount of an oxidizing agent to the metal source to form a dielectric layer therewith; purging the remaining oxidizing agent; repeating the cycle of feeding the metal source and removing the second portion of the metal source; and supplying a second predetermined amount of the oxidizing agent to the metal source by a chemical reaction therebetween such that the second predetermined amount of the oxidizing agent is supplied for a longer period of time than the first predetermined amount of the oxidizing agent.

The foregoing and/or other utilities of the present general inventive concept may also be achieved by providing a method of forming a dielectric layer on a semiconductor by a deposition process, the method including supplying a metal source together with an oxidizing agent onto the semiconductor substrate to form a dielectric layer by chemically reacting with each other, an amount of the oxidizing agent supplied being a predetermined first amount to prevent formation of an oxide layer between an electrode on a surface of the substrate and the dielectric layer; and repeating the supplying of a metal source and the oxidizing agent a predetermined number of times to form the dielectric layer, the amount of the oxidizing agent being supplied during each of the repeating cycles being different than the predetermined first amount to control the amount of carbon components throughout the dielectric layer.

The foregoing and/or other utilities of the present general inventive concept may also be achieved by providing a method of forming a dielectric layer, including performing a predetermined number of first cycles of a deposition on a semiconductor substrate to form a lower portion of the dielectric layer, the first cycles including supplying a metal source and a predetermined amount of an oxidizing agent on a surface of the semiconductor substrate; and performing a predetermined number of additional cycles of a deposition on the semiconductor substrate to form an upper portion of the dielectric layer, each of the additional cycles including supplying the metal source and a predetermined amount of the oxidizing agent on the lower portion of the dielectric layer, the predetermined amount of the oxidizing agent for each of the additional cycles being greater than the predetermined amount of the oxidizing agent supplied in the first cycles.

The foregoing and/or other utilities of the present general inventive concept may also be achieved by providing a method of manufacturing a dielectric layer by an atomic layer deposition (ALD) process, the method including performing a first process cycle including depositing a metal source on a surface of a semiconductor layer, purging an upper portion of the metal source, and supplying a predetermined amount of an oxidizing agent to the metal source on the semiconductor layer to chemically react with the metal source; repeating the first cycle a predetermined number of times; performing a second cycle including depositing the metal source on a surface of a semiconductor layer, purging an upper portion of the metal source, and supplying a predetermined amount of the oxidizing agent to the metal source to chemically react with the metal source, the predetermined amount of the oxidizing agent being greater than the amount of the oxidizing agent in the first cycle; and repeating the second cycle a predetermined number of times.

The foregoing and/or other utilities of the present general inventive concept may also be achieved by providing a method of forming a dielectric layer on a substrate, including supplying a reaction source and an oxidizing agent to chemically react with each other on an electrode formed above the substrate a predetermined number of times to form a respective predetermined number of material layers; and varying the amount of the oxidizing agent supplied during formation of certain ones of the material layers based on the distance of each of the material layers from the electrode.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
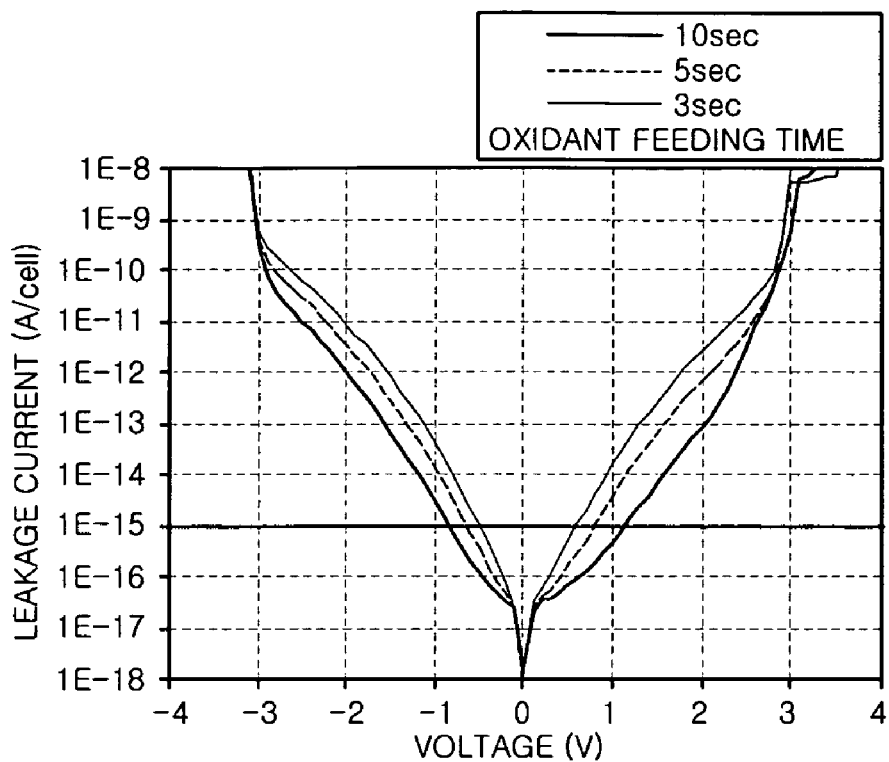
FIG. 1 is a chart illustrating leakage currents of an MIM capacitor based on a supplying time of an oxidizing agent.
Figure 2:
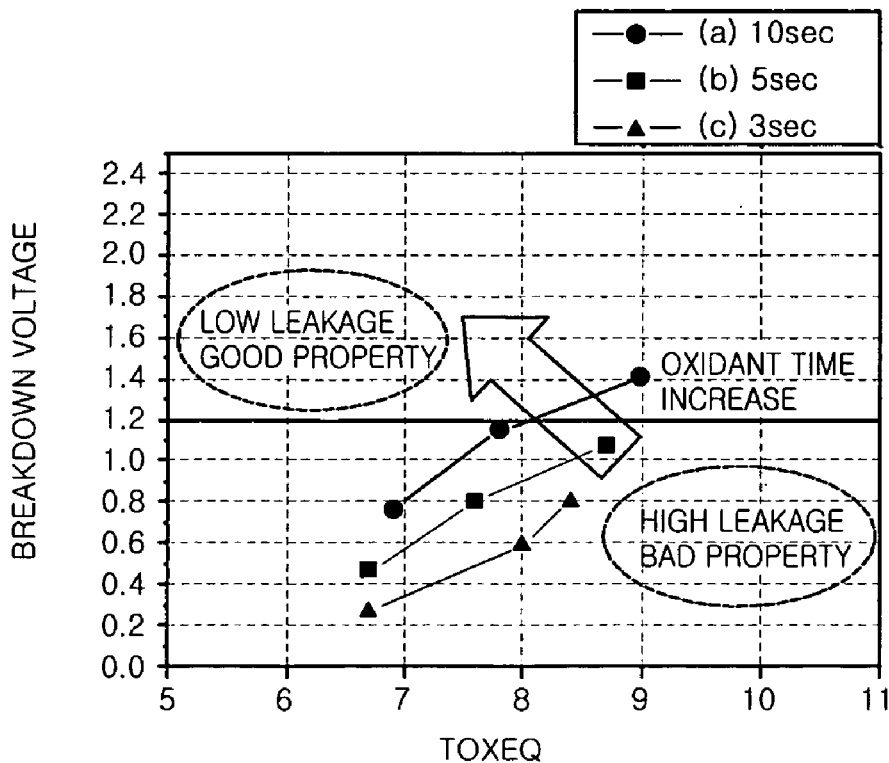
FIG. 2 illustrates a chart of breakdown voltages vs. effective equivalent oxide thickness (EOT) of an MIM capacitor in accordance with a supplying time of an oxidizing agent.
Figure 3:
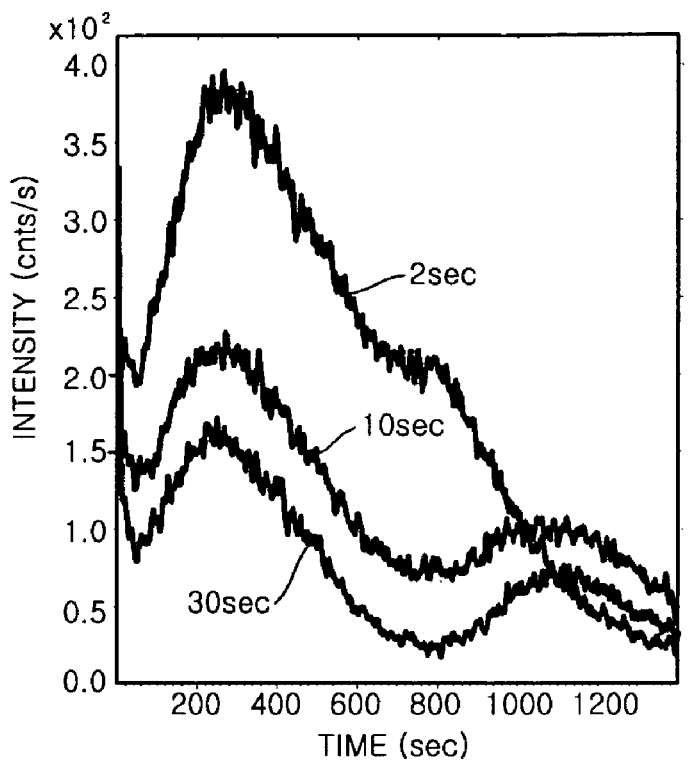
FIG. 3 is a graph illustrating carbon components in a dielectric layer in accordance with a supplying time of an oxidizing agent.
Figure 4:
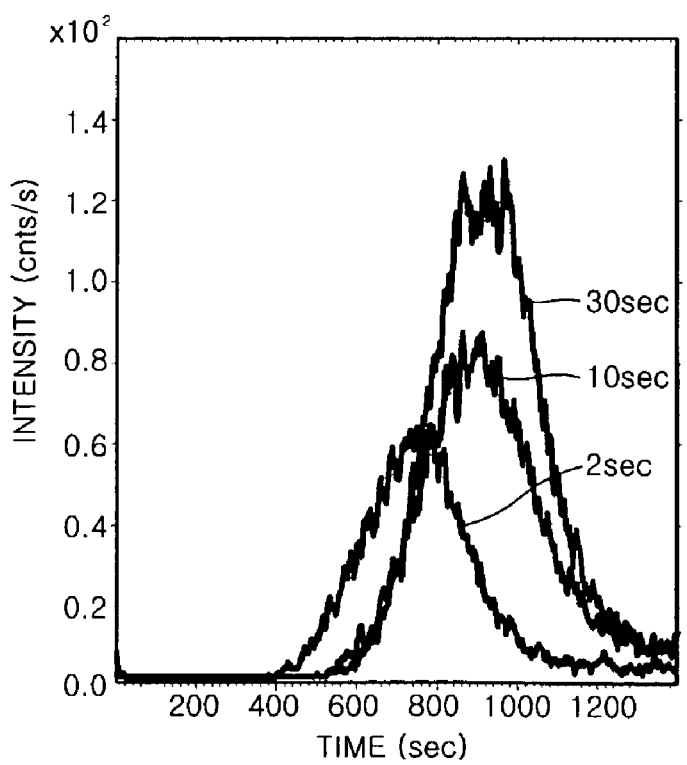
FIG. 4 is a graph illustrating dielectric components in a dielectric layer in accordance with a supplying time of an oxidizing agent.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Figure 5:
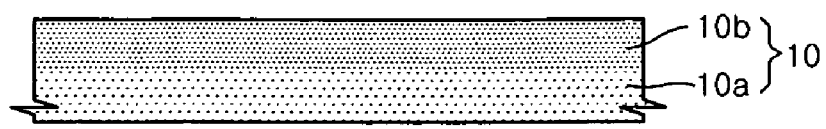
FIG. 5 illustrates a dielectric layer 10 of a metal-insulator-metal (MIM) capacitor, according to an embodiment of the present general inventive concept.

FIG. 5 illustrates a dielectric layer 10 of a metal-insulator-metal (MIM) capacitor, according to an embodiment of the present general inventive concept. This dielectric layer 10 includes a lower region 10a and an upper region 10b, which is formed above the lower region 10a. The dielectric layer 10 is formed by a chemical reaction between a reaction source (i.e., a metal source) and an oxidizing agent (i.e., ozone), while in a vacuum state. More specifically, in the lower region 10a of the layer 10, a layer of a metal source is applied to either a bottom electrode of an MIM capacitor or directly to a semiconductor substrate surface within a chamber under vacuum pressure. An oxidizing agent is then supplied to the metal source to chemically react with the metal source to form a layer of the lower region 10a. The oxidizing agent, which is supplied to the metal source to react therewith, can be $O_3$. The chemical reaction between the metal source (reaction source) and the oxidizing agent may be an atomic layer deposition (ALD) process. A predetermined number of layers can be provided to form the lower region 10a. Further, the upper region 10b can be similarly formed by a chemical reaction between the metal source and the oxidizing agent. However, the upper region 10b is formed under a condition in which the amount of oxygen used during formation of each of the predetermined number of layers is increased with respect to the amount of oxygen used in the lower region 10a. The amount of oxygen used can be controlled by several methods, such as the supply time thereof or the concentration amount thereof, or both. Thus, the amount of oxygen in the upper region 10b of the dielectric layer 10 is greater than the amount of oxygen in the lower region 10a of the dielectric layer 10. Furthermore, one or more layers can be formed as the dielectric layer 10.

In an exemplary embodiment of the present general inventive concept, a supplying time of oxidant per cycle can be two seconds and then sixty seconds. Table I below illustrates an exemplary embodiment of the present general inventive concept as compared to different oxidant supplying times per cycle, and how each of a leakage current, a total process time, a bottom TiN oxidation (oxidized layer), and Carbon are affected by the different oxidant supplying times. More specifically, as illustrated in Table I, with a long supplying time of an oxidizing agent (60 seconds), although the leakage current characteristics are good, and the carbon content is low, a bottom TiN layer or oxidized layer (between the dielectric layer and the electrode) is high, which results in a large equivalent thickness of oxide [EOT], which in turn results in poor interface characteristics between the dielectric layer and the layer beneath, such a the substrate or electrode. Furthermore, the process time is long.

In contrast with a long oxidizing agent supplying time, with a short supplying time of an oxidizing agent (2 seconds), although a total process time is short, and a bottom TiN layer or oxidized layer is insignificant, resulting in good interface characteristics, the carbon content of the resultant dielectric layer is high, resulting in poor leakage current characteristics. When the oxidant agent supplying time of first long (60 seconds) followed by a short supplying time (2 seconds), the carbon content tends to be average, which results in a bad leakage current, and a fairly high bottom TiN oxidation or oxidized layer, while the process time is adaptable.

In accordance with an embodiment of the present general inventive concept, as illustrated in FIG. 5 (FIG. 6 of DOI), when the oxidant supplying time is short (2 seconds) followed by a longer supplying time (60 seconds), the carbon content is low, the bottom TiN oxidation is low, and the leakage current characteristics is good. Furthermore, the total process time can be controlled to be relatively short.

TABLE I

|  | Oxidant 60 sec | Oxidant 2 sec | Oxidant 60 sec + 2 sec | Oxidant 2 sec + 60 sec |
|---|---|---|---|---|
| Leakage current | Good | Worst | Bad | Best |
| Total process Time | Very long | Short | Adaptable | Adaptable |
| Bottom TiN oxidation | High | Low | High (under analysis) | Low (under |
| Carbon | Low | High | Middle (under | Middle (under |

Referring back to FIG. 5, a lower electrode (not shown) of an MIM capacitor may be formed beneath the lower region 10a of the dielectric layer 10, while an upper electrode (not shown) of the MIM capacitor may be formed on the upper region 10b of the dielectric layer 10.

As stated above, the dielectric layer 10 may be formed by either an ALD process or a CVD process. Formation of the dielectric layer 10 according to an embodiment of the present general inventive concept will now be described with respect to using an atomic layer deposition process (ALD).

Figure 6:
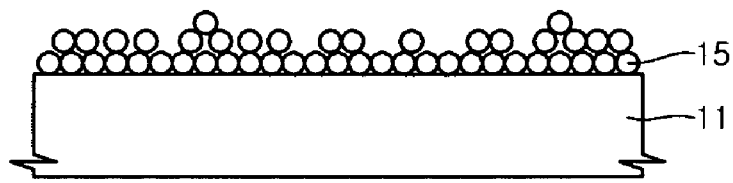
FIGS. 6-7 illustrate a process of applying a metal source to a surface of a semiconductor substrate to form the dielectric layer of FIG. 5, according to an embodiment of the present general inventive concept.

FIGS. 6-9 illustrate a method of forming the dielectric layer 10 of FIG. 5 using an ALD process, according to an embodiment of the present general inventive concept. As illustrated in FIG. 6, a metal source 15 can be applied/deposited onto a semiconductor substrate 11 in atomic layers. The semiconductor substrate 11 may include a silicone substrate, a lower electrode (not shown) over the substrate, etc. Some examples of the metal source may include a group IV metal such as Zr, Hf, Ti, etc., a group III metal such as Sc, Y, Al, Ga, In, etc., a group II metal such as Ba, Sr, Ca, etc., or a group V metal such as Nb, Ta, etc. These metal sources can be used alone or in combinations thereof.

Figure 7:
Figure 8:
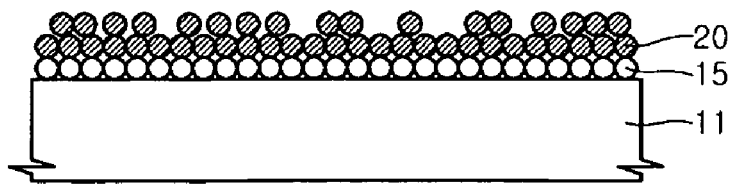
FIGS. 8-9 illustrate a process of supplying an oxidizing agent to the metal source of FIG. 7, according to an embodiment of the present general inventive concept.
Figure 9:
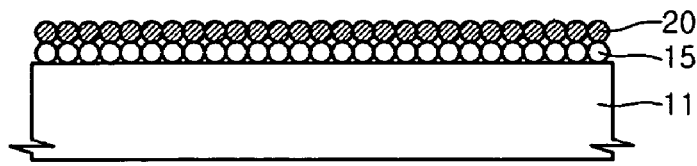
Figure 10A:
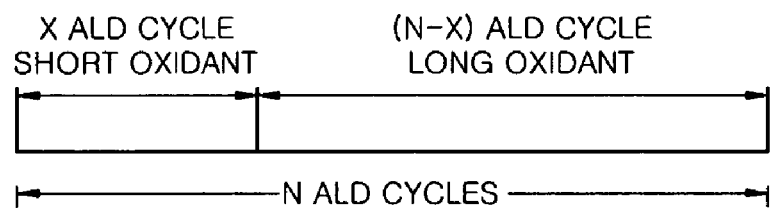
FIGS. 10A-10C illustrate supplying times of the oxidizing agent of FIGS. 8-9 during different cycles, according to an embodiment of the present general inventive concept.
Figure 10B:
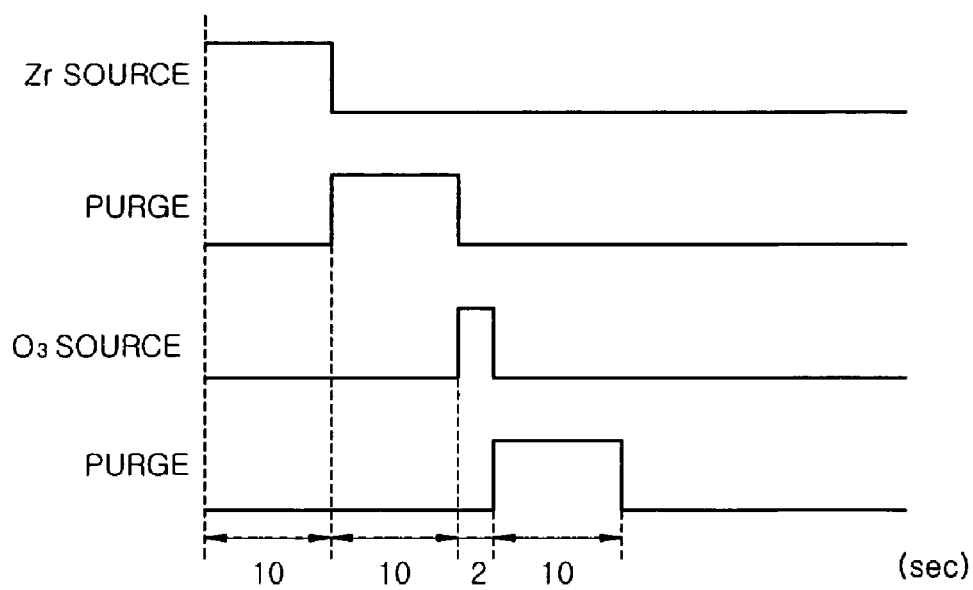
Figure 10C:
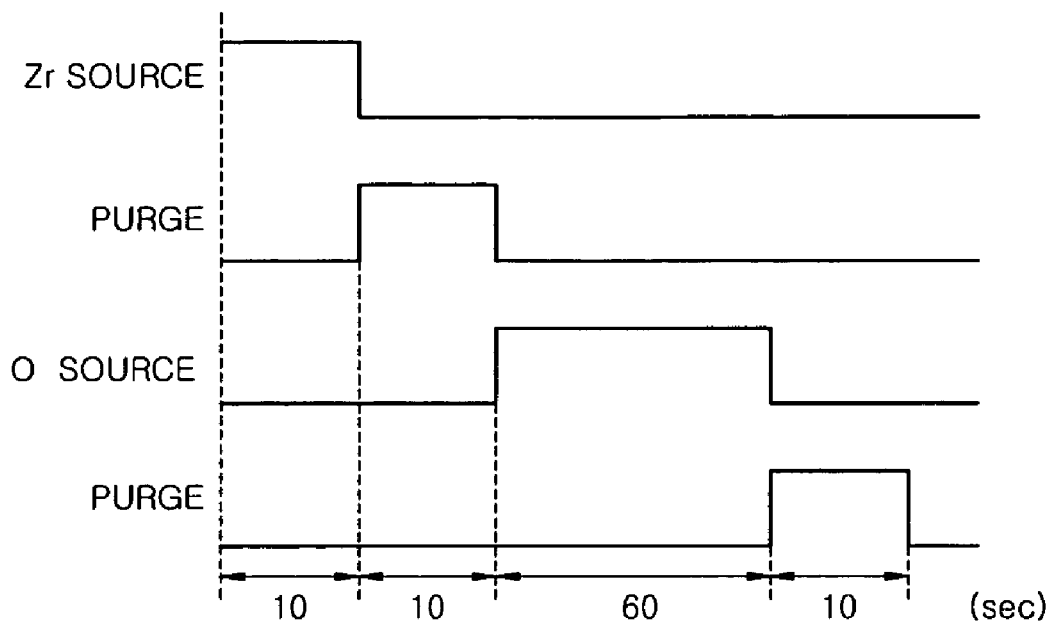

A first portion of the metal source 15 applied is chemisorbed onto the surface of the semiconductor substrate 11 or electrode (not shown). A second portion of the metal source 15 (not including the first portion) is physisorbed on the surface of the semiconductor substrate 11. Then the physisorbed second portion of the metal source 15 is removed by a purge process, resulting in a smooth surface of the metal source 15 being deposited onto the semiconductor substrate 11, electrode (not shown), etc., as illustrated in FIG. 7. Referring to FIG. 8, an oxidizing agent 20 is then be applied to the remaining metal source 15 (the portion not removed by purging process) to chemically react with the metal source 15. This chemical reaction can be achieved by providing an oxidizing agent, such as Ozone ($O_3$), which provides a free radical to react with the metal source 15. As can be seen in FIG. 8, additional amounts of oxidizing agent 20 may be supplied to the metal source 15. More specifically, an amount of oxidizing agent 20 beyond an amount that will react with the metal source 15 is applied to the metal source 15. Then, as illustrated in FIG. 9, the remaining oxidizing agent non-reacted with the metal source 15 is removed by another purge process to complete one cycle. Thus, one full cycle includes applying the metal source 15, purging, providing the oxidizing agent 20, and purging again. This cycle is repeated a predetermined number of times to form a dielectric layer according to the embodiment of FIG. 5. Moreover, in the present embodiment, the repeating of cycles as described above are divided into a first set of cycles and a second set of cycles. Further, a supplying time of the oxidizing agent in the first set of cycles is controlled to be shorter than that of a supplying time of the oxidizing agent in a conventional method. In contrast, a supplying time of the oxidizing agent in the second set of cycles is controlled to be longer than that of the oxidizing agent in the conventional method. Accordingly, the supplying time of the oxidizing agent in the first set of cycles is controlled to be shorter than that of the supplying time of the oxidizing agent in the second set of cycles. FIGS. 10A-10C illustrate the application times of the metal source, the first and second purging processes, and the supplying of oxidizing agent during the first set of cycles and the second set of cycles. As illustrated in FIGS. 10B and 10C, the oxidizing agent (i.e., $O_3$) is supplied for a time of approximately 2 seconds during the first set of cycles, and is supplied for a time of approximately 30 seconds during the second set of cycles.

As a result of the variation in the supplying time of the oxidizing agent during the first and second sets of cycles, the supplying time of the oxidizing agent in the first set of cycles may correspond to a time for completely exhausting an amount of the oxidizing agent which reacts with the applied/deposited metal source, without also reacting with a material under the dielectric layer formed by the reaction between the metal source and oxidizing agent, such as the semiconductor substrate, an electrode, etc. Furthermore, the supplying time of the oxidizing agent in the second set of cycles may correspond to a time for allowing an additional amount of oxidizing agent to remain, which does not react with a metal source, without causing a reaction between the oxidizing agent and the material under the dielectric layer (i.e., a semiconductor substrate, an electrode, etc). In other words, a predetermined amount of oxidizing agent is supplied which removes a substantial amount of the impurities from the metal source, without penetrating to the semiconductor substrate or other material layer beneath the formed dielectric layers.

In an exemplary embodiment of the present general inventive concept, ranges of a ratio between the first set of cycles and the second set of cycles are such that the first set of cycles can be about $\frac{1}{10}$ to $\frac{1}{2}$ of the entire set of cycles. For example, when eighty-four cycles of the process as described above are repeated to form the metal oxide layer dielectric layer, the oxidizing agent is first supplied to each of the metal source layers for a period of time of about two seconds to about five seconds during the first set of cycles, which can consist of from one cycle to twenty cycles to complete the first set of cycles. The oxidizing agent supplied in each cycle of the second set of cycles is provided for a period of time of about twenty seconds to about forty seconds during the second set of cycles, which can consist of from twenty-once cycles to eighty-four cycles to complete the second set of cycles. Accordingly, since the supplying time of the oxidizing agent in the first set of cycles is relatively short (2-5 seconds), the supplying amount of the oxidizing agent in the first set of cycles is controlled so that most of the oxidizing agent reacts with the metal source, and does not react with an underlying surface/layer on which the metal source is chemisorbed, such as a semiconductor layer, an electrode, etc. In contrast with the first set of cycles, since the supplying time of the oxidizing agent in the second set of cycles is relatively long (20-40 seconds), the supplying time of the oxidizing agent in the second set of cycles is controlled such that a substantial amount of impurities in the entire formed metal oxide layer can be removed. Moreover, since the supplying time and amount of the oxidizing agent is controlled cycle by cycle, a composition ratio between metal and oxygen in the metal oxide layer can be optimized. Still further, since the metal oxide layer is formed under a condition in which the oxygen is sufficiently provided (controlled by cycles), the metal oxide layer can have a desired dielectric constant.

Examples of the metal oxide layer forming the dielectric layer include a group IV metal oxide layer such as a $ZrO2$ layer, a $HfO2$ layer, a $TlO2$ layer, etc., a group III metal oxide layer such as an $Ln2O3$ layer, an $Sc2O3$ layer, an $Y2O3$ layer, an $Al_2O_3$ layer, a $Ga2O3$ layer, an $In2O3$ layer, etc., a group II metal oxide layer such as a $BaO$ layer, an $SrO$ layer, a $CaO$ layer, etc., or a group V metal oxide layer such as a $Nb2O5$ layer, a $Ta2O5$ layer, etc. Further, the metal oxide layers provided in the above examples can alternatively be used alone or in combinations thereof.

Figure 11:
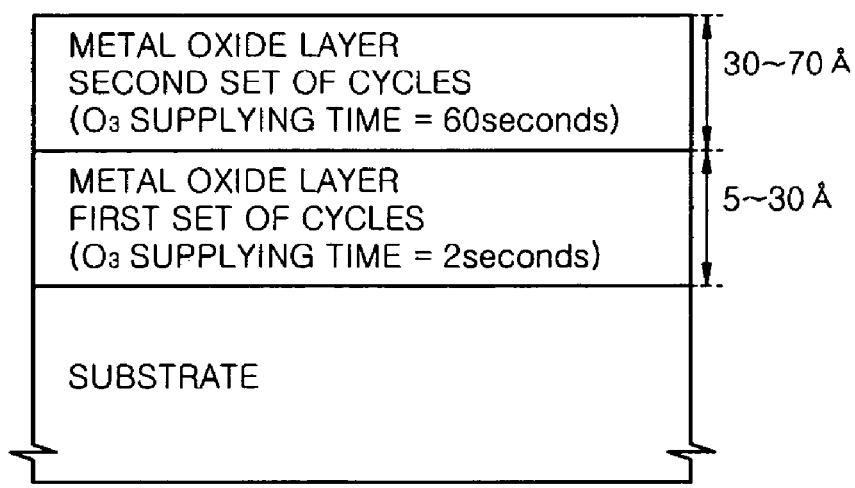
FIG. 11 illustrates supplying times of an oxidizing agent during different cycles in forming a dielectric layer, according to another embodiment of the present general inventive concept.

In another exemplary embodiment of the present general inventive concept, the amount of oxidizing agent supplied during the formation of the dielectric layer is provided as described below with reference to FIG. 11.

During a first set of cycles of applying a metal source onto a substrate in a vacuum state, purging the applied metal source, supplying an oxidizing agent to react with a remaining amount of metal source after purging, and purging the oxidizing agent, the period of time in which the oxidizing agent is supplied is for a time of approximately 2 seconds. This is repeated until an amount of metal oxide layer is formed on the substrate at a thickness of approximately 5-30 Å. Then, during a second set of cycles of applying a metal source, purging the metal source, supplying an oxidizing agent to react with a remaining amount of metal source after purging, and purging the oxidizing agent, the period of time in which the oxidizing agent is supplied is for a time of approximately 60 seconds. This is repeated until an additional amount of metal oxide layer (not including the amount formed during the first set of cycles) is formed to a thickness of approximately 30-70 Å. Thus, during the formation of the metal oxide layer (dielectric layer) in this exemplary embodiment, the second set of cycles, in which the oxidizing agent is supplied for a greater amount of time that during the first set of cycles, forms a substantially thicker amount of metal oxide layer than a thickness of the metal oxide layer formed during the first set of cycles. Moreover, the interface characteristics of the dielectric layer is good since the amount of oxidizing agent supplied during the first set of cycles is low, while the dielectric characteristics of the dielectric layer is good since the amount of oxidizing agent supplied during the second set of cycles is greater, which causes a low amount of impurities content therein.

Figure 12:
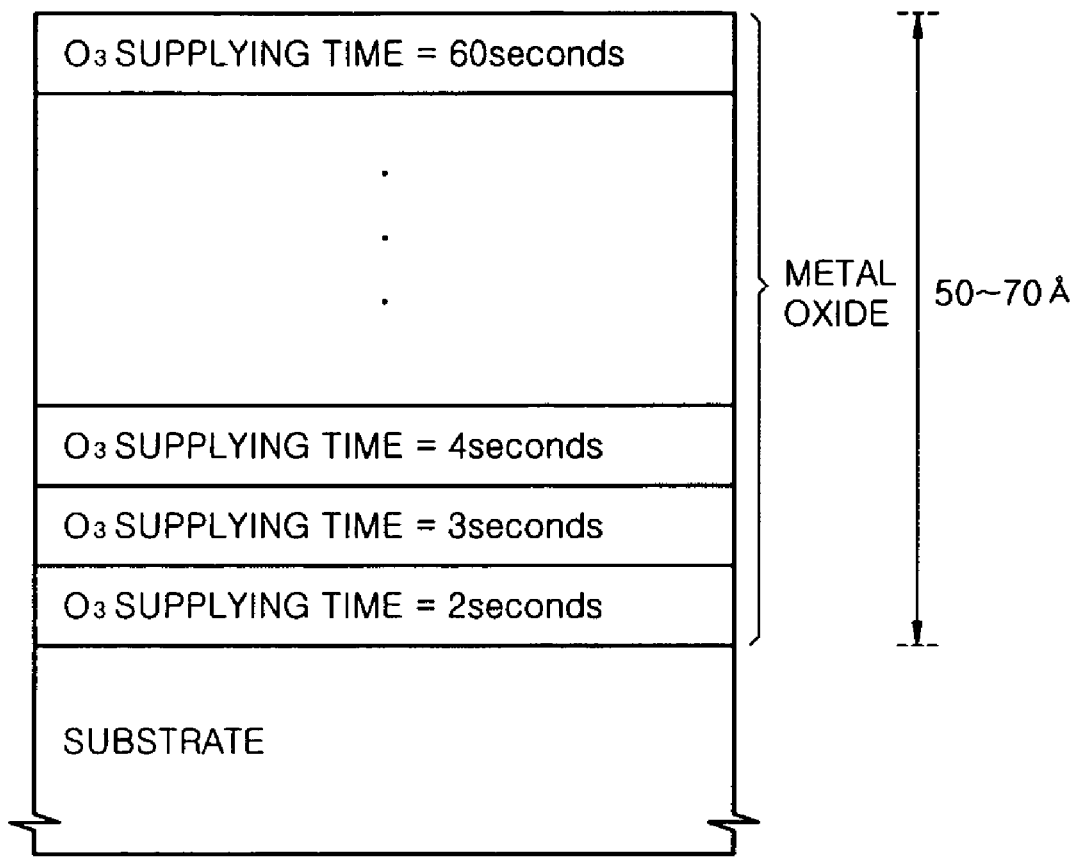
FIG. 12 illustrates supplying times of an oxidizing agent in forming a dielectric layer, according to another embodiment of the present general inventive concept.

In another exemplary embodiment of the present general inventive concept, the amount of oxidizing agent supplied during the formation of the dielectric layer is provided as described below with reference to FIG. 12.

In contrast with the previous exemplary embodiment described with reference to FIG. 11, where a the first and set of cycles are performed, the repeated cycles of applying a metal source, purging, supplying an oxidizing agent, and purging can be performed by changing the supplying time of the oxidizing agent in increments with respect to each layer. Here, a first set of cycles and a second set of cycles does not exist. More specifically, during formation of a first dielectric layer as performed by the process illustrated in FIG. 12, the oxidant (ozone) is supplied to a layer of a metal source formed on a substrate for a time period of approximately 2 seconds. During the formation of the next metal oxide layer, the oxidant is supplied to another layer of metal source for a time period of approximately 3 seconds. This process is repeated while incrementing the supplying time of the oxidant by one second steps until the a chemical reaction is performed between a layer of metal source and an amount of oxidant supplied to the layer of metal source for a time period of approximately 60 seconds. In other words, the amount of time of supplying the oxidant to each of the metal layers increases in increments of seconds from two seconds to sixty seconds (2, 3, 4, . . . 60 sec.). The process according to this exemplary embodiment results in a metal oxide layer (dielectric layer) having a thickness of approximately 50-70 Å.

Figure 13A:
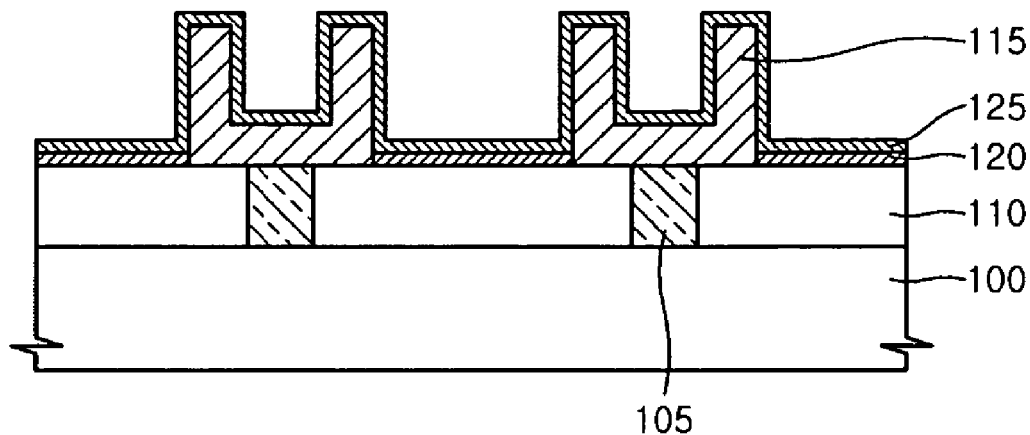
FIGS. 13A and 13B illustrate formation of the dielectric layers according to the various embodiments of the present general inventive concept in an MIM capacitor.
Figure 13B:
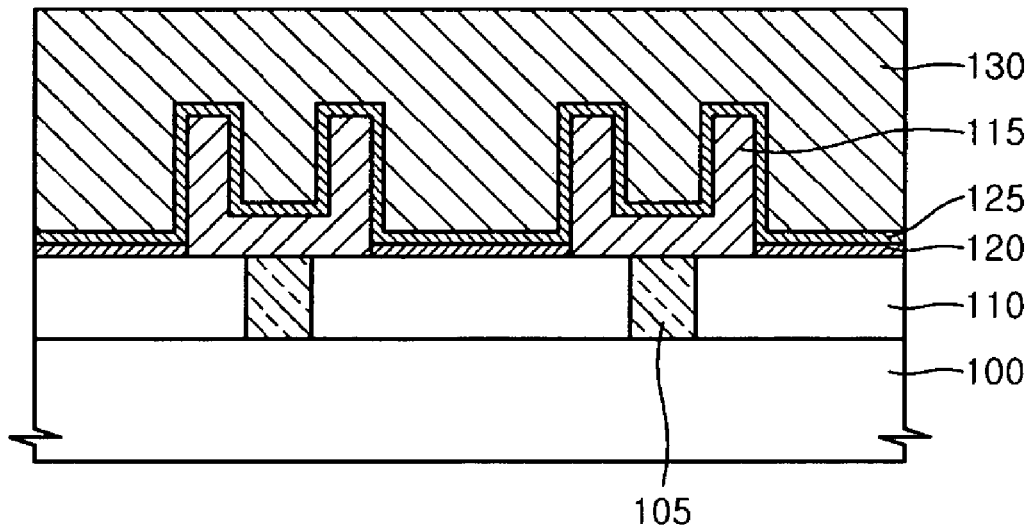

FIGS. 13A and 13B illustrate formation of the dielectric layers according to the various embodiments of the present general inventive concept in an MIM capacitor. Any of the dielectric layers according to the various embodiments of the present general inventive concept can be formed as the layer 125 above a lower electrode 115 and below an upper electrode 130 to form the capacitor. A contact plug 105 can be formed over a substrate 100 to apply a potential to the lower electrode 115. More specifically, an interlayer dielectric layer 110 can be formed on the semiconductor substrate 100 having the contact plug 105. There may be a circuit device and a coupler such as a MOS transistor between the semiconductor substrate 100 and the interlayer dielectric layer 110. The contact plug 105 within the interlayer dielectric layer 110 is formed with a metal material such as titanium nitride (TiN). The contact plug 105 can be formed to contact the electrode area of the MOS transistor, or a coupler can be electrically connected with the electrode area.

The lower electrode 115 can be formed with a metal such as titanium nitride (TiN) or a noble metal such as ruthenium (Ru) or platinum (Pt). An etch stopper 120 can be formed between the interlayer dielectric layer 110 and the lower electrode 115. Finally, the dielectric layer 125 can be formed on the surface of the lower electrode 115 and the etch stopper 120. The dielectric layer 125, as described above in the various embodiments of the present general inventive concept, has a high dielectric constant and is formed of a metal oxide.

The method of forming a dielectric layer and an MIM capacitor using the method of forming the dielectric layer provides a dielectric layer and an MIM capacitor having great electrical characteristics with low impurity content, good leakage current characteristics and great interface characteristics, while having a low amount of time required for fabricating the dielectric layer and MIM capacitor.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of forming a dielectric layer by a deposition process, comprising:
   feeding a metal source on a surface of a semiconductor substrate such that a first portion of the metal source is chemisorbed on the substrate and a second portion of the metal source is physisorbed on the substrate;
   removing the second portion of the metal source by a purge process;
   supplying a first predetermined amount of an oxidizing agent to the metal source to form a metal oxide layer therewith;
   purging the remaining oxidizing agent;
   repeating the cycles of feeding a metal source and removing the second portion of the metal source; and
   supplying a second predetermined amount of the oxidizing agent to the metal source to cause a chemical reaction between the metal source and the second predetermined amount of the oxidizing agent to form another metal oxide layer such that the second predetermined amount of the oxidizing agent is supplied for a longer period of time than the first predetermined amount of the oxidizing agent.

2. The method of claim 1, wherein the supplying time of the first predetermined amount of oxidizing agent corresponds to a time to completely exhaust the amount of the oxidizing agent supplied.

3. The method of claim 2, wherein the supplying time of the second predetermined amount of the oxidizing agent corresponds to a time to allow an amount of oxidizing agent which does not reacted with the metal source to remain.

4. The method of claim 1, wherein the operations of repeating feeding a metal source and supplying a second predetermined amount of the oxidizing agent are repeated sequentially for a predetermined number of times.

5. The method of claim 4, wherein the first cycle is approximately 1/10 to 1/2 of the entire number of cycles performed to form the dielectric layer.

6. The method of claim 1, wherein the oxidizing agent is ozone.

7. The method of claim 1, wherein the applied metal source and the supplying of oxidizing agent form the dielectric layer by a chemical reaction therebetween.

8. The method of claim 7, wherein the chemical reaction corresponds to an atomic layer deposition (ALD) process.

9. The method of claim 7, wherein the chemical reaction corresponds to a chemical vapor deposition (CVD) process.

10. A method of forming a dielectric layer on a semiconductor by a deposition process, the method comprising:
    supplying a metal source together with an oxidizing agent onto the semiconductor substrate to form a metal oxide layer by chemically reacting the metal source and the oxidizing agent, the amount of the oxidizing agent supplied being a predetermined first amount to prevent formation of an oxide layer between an electrode on a surface of the substrate and the dielectric layer; and
    repeating the supplying of a metal source and the oxidizing agent a predetermined number of times to form the dielectric layer, the amount of oxidizing agent supplied during each of the repeating cycles being different than the predetermined first amount to control the amount of carbon components throughout the dielectric layer.

11. The method of claim 10, wherein the amount of oxidizing agent supplied during the repeating operations is greater than the predetermined first amount.

12. The method of claim 11, wherein the amount of oxidizing agent supplied is controlled by the supplying time.

13. A method of forming a dielectric layer, comprising:
    performing a predetermined number of first cycles of a deposition on a semiconductor substrate to form a lower portion of the dielectric layer, the first cycles including supplying a metal source and a predetermined amount of an oxidizing agent on a surface of the semiconductor substrate to cause a chemical reaction between the metal source and the predetermined amount of the oxidizing agent to form the lower portion of the dielectric layer; and
    performing a predetermined number of additional cycles of a deposition on a semiconductor substrate to form an upper portion of the dielectric layer, each of the additional cycles including supplying the metal source and a predetermined amount of the oxidizing agent on the lower portion of the dielectric layer to cause a chemical reaction between the metal source and the predetermined amount of the oxidizing agent to form the upper portion of the dielectric layer, the predetermined amount of oxidizing agent for each of the additional cycles being greater than the predetermined amount of oxidizing agent supplied in the first cycles.

14. The method of claim 13, wherein a lower electrode of a capacitor is formed on a lower surface of the dielectric layer and an upper electrode of the capacitor is formed on an upper surface of the dielectric layer.

15. A method of manufacturing a dielectric layer by an atomic layer deposition (ALD) process, comprising:
    performing a first process cycle including:
    depositing a metal source on a surface of a semiconductor layer,
    purging an upper portion of the metal source, and
    supplying a predetermined amount of oxidizing agent to the metal source on the semiconductor layer to chemically react with the metal source;

repeating the first cycle a predetermined number of times;
performing a second cycle including:
depositing a metal source on a surface of a semiconductor layer,
purging an upper portion of the metal source, and
supplying a predetermined amount of oxidizing agent to the metal source to chemically react with the metal source, the predetermined amount of oxidizing agent being greater than the amount of oxidizing agent supplied in the first cycle; and
repeating the second cycle a predetermined number of times.

16. A method of forming a semiconductor memory device, the method comprising:

forming an electrode on a substrate; and
forming a dielectric layer on the electrode, the forming of the dielectric layer comprising:
forming a lower region by causing a chemical reaction between a reactant source and a first predetermined amount of an oxidizing agent, and
forming an upper region by causing a second chemical reaction between the reactant source and a second predetermined amount of the oxidizing agent which is greater than the first predetermined amount of the oxidizing agent.

* * * * *